United States Patent
Edmond

(10) Patent No.: US 7,932,111 B2
(45) Date of Patent: Apr. 26, 2011

(54) SUBSTRATE REMOVAL PROCESS FOR HIGH LIGHT EXTRACTION LEDS

(75) Inventor: John Edmond, Cary, NC (US)

(73) Assignee: Cree, Inc., Durham, NC (US)

( * ) Notice: Subject to any disclaimer, the term of this patent is extended or adjusted under 35 U.S.C. 154(b) by 125 days.

(21) Appl. No.: 11/064,798

(22) Filed: Feb. 23, 2005

(65) Prior Publication Data
US 2006/0189098 A1    Aug. 24, 2006

(51) Int. Cl.
*H01L 21/8252* (2006.01)

(52) U.S. Cl. ........ 438/33; 438/458; 257/E21.6; 257/E21.601; 257/E33.057

(58) Field of Classification Search ............ 438/26, 438/28–33, 458; 257/E21.6, E21.601, E33.055–E33.057
See application file for complete search history.

(56) References Cited

U.S. PATENT DOCUMENTS

| | | | |
|---|---|---|---|
| 4,902,356 A | 2/1990 | Noguchi et al. | 148/33.4 |
| 4,912,532 A | 3/1990 | Cook et al. | 357/16 |
| 5,103,271 A | 4/1992 | Izumiya et al. | 357/17 |
| 5,376,580 A | 12/1994 | Kish et al. | 437/127 |
| 5,502,316 A | 3/1996 | Kish et al. | 257/94 |
| 5,679,152 A | 10/1997 | Tischler et al. | 117/97 |
| 5,985,687 A | 11/1999 | Bowers et al. | 438/46 |
| 6,071,795 A | 6/2000 | Cheung et al. | 438/458 |
| 6,111,272 A * | 8/2000 | Heinen | 257/94 |
| 6,210,479 B1 | 4/2001 | Bojarczuk et al. | 117/84 |
| 6,258,699 B1 | 7/2001 | Chang et al. | 438/458 |
| 6,303,405 B1 * | 10/2001 | Yoshida et al. | 438/46 |
| 6,355,501 B1 * | 3/2002 | Fung et al. | 438/107 |
| 6,365,429 B1 | 4/2002 | Kneissl et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,429,460 B1 * | 8/2002 | Chen et al. | 257/79 |
| 6,448,102 B1 | 9/2002 | Kneissl et al. | 438/46 |

(Continued)

FOREIGN PATENT DOCUMENTS

WO    WO 2004013916 A1 *   2/2004

(Continued)

OTHER PUBLICATIONS

Kelly, M.K., et al., "Optical Process for liftoff of group III-nitride films", Physica Status Solidi (a), vol. 159, issue 1, pp. 1-2, Jan. 1997.*

(Continued)

*Primary Examiner* — Matthew W Such
(74) *Attorney, Agent, or Firm* — Koppel, Patrick, Heybl & Dawson

(57) ABSTRACT

A method for fabricating light emitting diode (LEDs) comprises providing a plurality of LEDs on a substrate wafer, each of which has an n-type and p-type layer of Group-III nitride material formed on a SiC substrate with the n-type layer sandwiched between the substrate and p-type layer. A conductive carrier is provided having a lateral surface to hold the LEDs. The LEDs are flip-chip mounted on the lateral surface of the conductive carrier. The SiC substrate is removed from the LEDs such that the n-type layer is the top-most layer. A respective contact is deposited on the n-type layer of each of the LEDs and the carrier is separated into portions such that each of the LEDs is separated from the others, with each of the LEDs mounted to a respective portion of said carrier.

30 Claims, 7 Drawing Sheets

U.S. PATENT DOCUMENTS

| | | | |
|---|---|---|---|
| 6,465,809 B1 | 10/2002 | Furukawa et al. | 257/94 |
| 6,468,821 B2 * | 10/2002 | Maeda et al. | 438/29 |
| 6,468,824 B2 | 10/2002 | Chen et al. | 438/46 |
| 6,475,889 B1 | 11/2002 | Ring | 438/571 |
| 6,475,920 B2 * | 11/2002 | Coburn et al. | 438/714 |
| 6,518,079 B2 * | 2/2003 | Imler | 438/33 |
| 6,559,075 B1 | 5/2003 | Kelly et al. | 438/795 |
| 6,562,648 B1 | 5/2003 | Wong et al. | 438/46 |
| 6,607,931 B2 | 8/2003 | Streubel | 438/22 |
| 6,657,236 B1 | 12/2003 | Thibeault et al. | 257/98 |
| 6,677,173 B2 | 1/2004 | Ota | 438/22 |
| 6,716,654 B2 | 4/2004 | Hsu et al. | 438/22 |
| 6,740,604 B2 | 5/2004 | Kelly et al. | 438/795 |
| 6,746,889 B1 * | 6/2004 | Eliashevich et al. | 438/33 |
| 6,757,314 B2 | 6/2004 | Kneissl et al. | 372/50 |
| 6,786,390 B2 | 9/2004 | Yang et al. | 228/179.1 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,821,804 B2 | 11/2004 | Thibeault et al. | |
| 6,846,686 B2 | 1/2005 | Saeki et al. | 438/22 |
| 6,849,878 B2 | 2/2005 | Bader et al. | 257/103 |
| 6,878,563 B2 * | 4/2005 | Bader et al. | 438/22 |
| 6,884,646 B1 * | 4/2005 | Wu et al. | 438/22 |
| 6,933,189 B2 * | 8/2005 | Clevenger et al. | 438/216 |
| 6,969,635 B2 * | 11/2005 | Patel et al. | 438/107 |
| 7,019,323 B2 * | 3/2006 | Shakuda et al. | 257/13 |
| 7,098,063 B2 * | 8/2006 | Miyachi et al. | 438/33 |
| 7,115,519 B2 * | 10/2006 | Yamaguchi | 438/706 |
| 7,179,670 B2 * | 2/2007 | Shelton et al. | 438/26 |
| 7,244,628 B2 * | 7/2007 | Tamura et al. | 438/33 |
| 7,432,119 B2 * | 10/2008 | Doan | 438/33 |
| 7,511,311 B2 * | 3/2009 | Kususe et al. | 257/95 |
| 2001/0042866 A1 * | 11/2001 | Coman et al. | 257/103 |
| 2002/0068373 A1 * | 6/2002 | Lo et al. | 438/33 |
| 2002/0153832 A1 * | 10/2002 | Yanagisawa et al. | 313/505 |
| 2003/0015721 A1 * | 1/2003 | Slater et al. | 257/99 |
| 2003/0153108 A1 * | 8/2003 | Durocher et al. | 438/26 |
| 2003/0173602 A1 | 9/2003 | Hsu et al. | |
| 2003/0178626 A1 * | 9/2003 | Sugiyama et al. | 257/79 |
| 2003/0197170 A1 * | 10/2003 | Bader et al. | 257/14 |
| 2004/0033628 A1 * | 2/2004 | Huang et al. | 438/1 |
| 2004/0033638 A1 * | 2/2004 | Bader et al. | 438/46 |
| 2004/0056254 A1 * | 3/2004 | Bader et al. | 257/79 |
| 2004/0072382 A1 | 4/2004 | Kelly et al. | |
| 2004/0248377 A1 | 12/2004 | Yoo et al. | |
| 2005/0048739 A1 * | 3/2005 | Kerdiles et al. | 438/458 |
| 2005/0147950 A1 * | 7/2005 | Ortiz et al. | 434/238 |
| 2005/0170611 A1 * | 8/2005 | Ghyselen et al. | 438/458 |
| 2005/0236365 A1 * | 10/2005 | Komatani | 216/67 |
| 2005/0247950 A1 * | 11/2005 | Nakamura et al. | 257/98 |
| 2006/0091409 A1 * | 5/2006 | Epler et al. | 257/95 |
| 2006/0138443 A1 * | 6/2006 | Fan et al. | 257/100 |
| 2006/0244001 A1 * | 11/2006 | Lee et al. | 257/103 |

FOREIGN PATENT DOCUMENTS

| | | | |
|---|---|---|---|
| WO | WO 2004061944 A1 * | 7/2004 | |
| WO | WO 2005043631 A2 * | 5/2005 | |

OTHER PUBLICATIONS

Wang., J.J., et al., "Inductively coupled plasma etching of bulk 6H-SiC and thin-film SiCN in NF3 chemistries", J. Vac. Sci. Technol. A 16(4), Jul./Aug. 1998.*

Eiting, C.J., Grudowski, P.A., Dupuis, R.D., "Growth of low resistivity p-type GaN by metal organic chemical vapour deposition", Electronics Letters, vol. 33, No. 23, pp. 1987-1989, Nov. 6, 1997.*

Wang., J.J., et al., "Inductively coupled plasma etching of bulk 6H-SiC and thin-film SiCN in NF3 chemistries", J. Vac. Sci. Technol. A 16(4), Jul./Aug. 1998.*

Wang., J.J., et al., "Inductively coupled plasma etching of bulk 6H-SiC and thin-film SiCN in NF3 chemistries", J. Vac. Sci. Technol. A 16(4), Jul./Aug. 1998.*

Wang., J.J., et al., "Inductively coupled plasma etching of bulk 6H-SiC and thin-film SiCN in NF3 chemistries", J. Vac. Sci. Technol. A 16(4), Jul./Aug. 1998.*

Wang., J.J., et al., "Inductively coupled plasma etching of bulk 6H-SiC and thin-film SiCN in NF3 chemistries", J. Vac. Sci. Technol. A 16(4), Jul./Aug. 1998.*

Ruberto, M.N., et al. "The Laser-Controlled Micrometer-Scale Photoelectrochemical Etching of III-V Semiconductors." J. Electrochem. Soc., vol. 138, No. 4, (Apr. 1991): pp. 1174-1185.*

Chu, C.-F., et al. "Study of GaN Light-Emitting Diodes Fabricated by Laser Lift-Off Technique." J. Appl. Phys., vol. 95, No. 8, (Apr. 15, 2004): pp. 3916-3922.*

M.K. Kelly et al., "Optical Process for Liftoff of Group III-Nitride Films", Rapid Research Note, Technische Universität Münche, Garching, Germany, (Nov. 28, 1996) pp. 1-2.

E.F. Schubert et al., "Resonant Cavity Light-Emitting Diode", AT&T Bell Laboratories, Murray Hill, New Jersey, (1991) pp. 921-923.

E.F. Schubert, *Light Emitting Diodes*, Cambridge University Press, (2003) pp. 198-211.

* cited by examiner

SUBSTRATE REMOVAL PROCESS FOR HIGH LIGHT EXTRACTION LEDS

BACKGROUND OF THE INVENTION

1. Field of the Invention

This invention relates to a method for fabricating a semiconductor device, and more particularly to a method for fabricating a light emitting semiconductor device on a conducting carrier.

2. Description of the Related Art

Improvements in the manufacturing of semiconductor materials in the Group-III nitride material system has helped advance the development of GaN/AlGaN optoelectronic devices such as high efficiency blue, green and ultra-violet (UV) light emitting diodes (LED or LEDs) and lasers, and electronic devices such as high power microwave transistors. Some of the advantages of GaN is its 3.4 eV wide direct bandgap, high electron velocity ($2 \times 10^7$ cm/s), high breakdown field ($2 \times 10^6$ V/cm) and the availability of heterostructures.

Typical LEDs can comprise a p-type doped layer and an n-type doped layer such that when a bias is applied across the doped layers the LED emits light. Other LEDs can comprise an active region sandwiched between the n- and p-type doped layers such that when a bias is applied across the doped layer electrons and holes are injected into the active region, where they recombine to generate light. LED light is typically generated omnidirectionally in an "emission sphere" with light radiating in all directions within the material that makes up the LED structure. LEDs are efficient at generating light, but the light has difficulties emitting from the LED to the surroundings because of the differences in the indexes of refraction between the LED material and surroundings. In an LED having layers and regions of a typical thickness, only the photons formed in a cone about 20° wide in the direction of a surface exit the structure. The remainder of the light is trapped within the structure of the LED, and can eventually become absorbed into the semiconductor material, which reduces the overall emitting efficiency of the LED.

Different methods have been developed for improving the light emitting efficiency of typical LEDs, some of which include using non-planar shaped LEDs and roughening the emission surface of an LED. Both of these approaches improve emitting efficiency by providing an LED surface that has different angles such that when light from the LED's active region reaches the surface with varying angles between the light rays and the surface. This increases the possibility that the light will be within the 20° cone when it reaches the surface such that it emits from the LED. If it is not within the 20° angle, the light is reflected at different angles, increasing the likelihood that the light will be within the cone the next time it reaches the surface.

LEDs can be fabricated on a substrate, such as SiC and then flip-chip mounted so that the substrate becomes the primary emitting surface of the LED. Light generated from the LEDs active region is largely coupled into the higher index of refraction SiC substrate from which it must then be extracted. Light can become trapped within the substrate by total internal reflection (TIR), which reduces the overall emission efficiency of the device.

Light extraction can be improved by shaping the SiC substrate, such as by tapering the substrate side walls. One disadvantage of this approach is that shaping the substrate requires the cross sectional area to be reduced locally, leading to higher series resistance. In addition, the shaping of the substrate must scale in all dimensions as the lateral dimension of the chip is increased. This requires the SiC substrate to be made thicker as the lateral dimensions of the chip are increased to accommodate a proportionally longer taper of the side wall. There are other disadvantages to having a SiC substrate, such as difficulties in contacting the n-type layer. In addition, some embodiments having a SiC substrate, a conducting buffer layer is included between the substrate and the n-type layer to spread current to the n-type layer. This buffer layer, however, can absorb power during LED operation.

SUMMARY OF THE INVENTION

The present invention provides a method for fabricating a solid state light emitting device, such as an LED, wherein the substrate is removed, which provides a number of advantages as fully described below. One embodiment of a method for fabricating semiconductor based light emitting devices according to the present invention comprises providing a plurality of semiconductor light emitting devices on a substrate wafer, each of said emitting devices comprising epitaxial layers. A carrier is provided and the emitting devices are flip-chip mounted on the carrier such that the emitting devices are sandwiched between the carrier and substrate wafer. The substrate wafer is removed from the emitting devices and the carrier is separated into portions such that each of the emitting devices is separated from the others, with each of the emitting devices mounted to a respective portion of the carrier.

The methods according to the present invention can be used to fabricate LEDs, one such method comprising providing a plurality of LEDs on a SiC substrate wafer, each of the LEDs having an n-type layer and p-type layer, with n-type layer sandwiched between the substrate wafer and p-type layer. A carrier is provided having a lateral surface to hold the LEDs. The LEDs are flip-chip mounted on the carrier lateral surface such that the LEDs are sandwiched between the substrate wafer and the carrier. The SiC substrate is removed from the LEDs such that said n-type layer is the top-most layer and a respective contact is deposited on the n-type layer of each of the LEDs. The carrier is separated into portions such that each of the LEDs is separated from the others, with each of the LEDs mounted to a respective portion of the carrier.

After fabrication by the methods according to the present invention, the LEDs (and other semiconductor light emitting devices) are typically encased in an encapsulating material. The semiconductor material comprising the LED has a better index match with the encapsulating material compared to SiC, which inherently results in improved light extraction from the LED to the encapsulating material. The methods according to the present invention are applicable to fabricating Group-III nitride LEDs, and particularly GaN LEDs. Removing the substrate allows for making good ohmic contact directly to the n-GaN. This eliminates the need for a conducting buffer layer at the SiC—GaN interface, which eliminates the power dissipation at that interface and can improve wall plug efficiency of the LED. Removing the substrate also eliminates the need for making the substrate thicker as the lateral dimensions of the chip are increased for LEDs having a taper of the sidewalls.

These and other features and advantages of the invention will be apparent to those skilled in the art from the following detailed description, taken together with the accompanying drawings, in which:

DETAILED DESCRIPTION OF THE INVENTION

Figure 1:
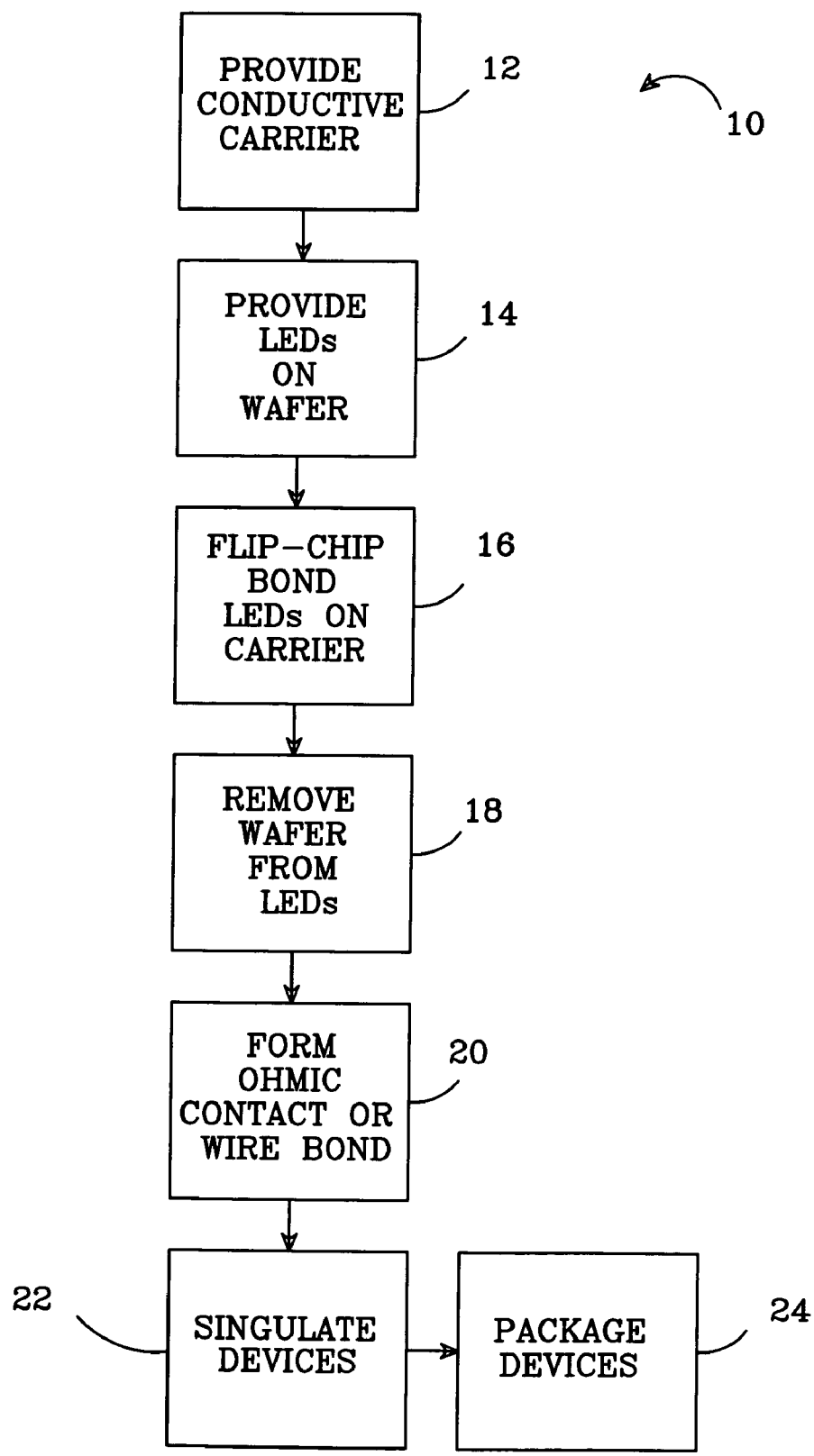
FIG. 1 is a flow diagram for one embodiment of a fabrication method according to the present invention.

FIG. 1 shows one embodiment of a method 10 according to the present invention for fabricating light emitting semiconductor devices, with the method 10 particularly adapted to fabricating singulated vertical geometry light emitting diodes (LEDs) on a submount/carrier ("carrier") with the substrate on each LED removed. In one embodiment of the method 10, LEDs are made from the Group-III nitride material system, such as AlGaN/GaN, and are fabricated on a conductive carrier. In step 12, a conductive carrier is provided that is sized such that a plurality of LEDs can be mounted on one of its lateral surfaces. Desirable characteristics of the carrier are low cost, low resistivity, good thermal conductivity, and good coefficient of thermal expansion relative to the bonded devices.

Many different types of carriers can be used having different structures. In one embodiment, the carrier can comprise a semiconductor material, such as SiC or Si, and to provide low resistivity characteristics. The carrier lateral surfaces intended for bonding to LEDs device by soldering should be metallized with a low resistivity material. The metallization of the side surfaces semiconductor carrier should form ohmic contacts to each side. The lateral surfaces of the carrier that are being bonded should also be processed so that any solder bond does not degrade the ohmic contact to the side surfaces. For example, the metal on the soldered surface could be comprised of an ohmic contact, such as titanium, followed by a solder barrier, such as Ni, TiW, or W, followed by a solderable layer, such as Ni, Ni/Au, Ni/AuSn, Ni/Sn. The semiconductor carrier can be metallized using known methods, such as sputtering.

In other embodiments, the carrier can comprise a metallic material including, but not limited to, Cu, Cu—W or Cu—Mo—Cu. These metallic materials have low resistivity and as a result, metallization of the lateral surfaces is not necessary. The carrier also can be one of a single construction or can include a number of different structural members, and the carrier can include passive and active electronic components to drive the LEDs that are mounted to it.

In step 14, LEDs are provided that are mounted to a wafer/substrate. The LEDs can be made of different material systems that are compatible with growth on SiC, with, as mentioned above, the preferred material system being Group-III nitride material system. SiC has a closer crystal lattice match to Group-III nitrides, which generally results in Group-III nitride films of high quality. SiC also has high thermal conductivity so that the total output power of Group-III nitride devices on SiC is not limited by the thermal dissipation of the substrate (as is the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022. Some examples of Group-III nitride materials that can be used with the LEDs include: gallium nitride (GaN), indium gallium nitride (InGaN) and aluminum gallium nitride (AlGaN).

Some examples of commercially available devices that can be used for the LEDs in the method 10 include, but are not limited to, the XB900™ Power Chip, XBright® LED, and XBright®Plus LED all available from Cree Research, Inc., of Durham, N.C. Typical LEDs used in the method 10 are fabricated with an n-type layer on the SiC substrate, p-type layer on the n-type layer, and any active region sandwiched between the n- and p-type layers. Mirror layers can also be included that are arranged to further enhance light extraction from the finally fabricated devices.

The individual LEDs can be formed by first depositing the n- and p-type layers (and mirror layers) on the SiC substrate. The layers can then be divided into individual devices on the SiC preferably by known methods of mesa etching or by mechanical sawing, laser cutting, and water-jet cutting, all of which cut through the n- and p-type layers while not cutting through the SiC substrate. The individual devices can have different sizes with the suitable range of sizes being 250-300 microns square, and depending on the size of the substrate more than 20,000 devices can be included on the wafer. In alternative embodiments according to the present invention, the n- and p-type layers can be left on the substrate as continuous layers, and then divided into individual devices after flip-chip mounting as described below.

In step 16, the substrate with its LEDs is inverted and flip-chip mounted on a lateral surface of the carrier, and in a preferred embodiment the LEDs are bonded in place. The LEDs should be positioned such that there is room between adjacent LEDs to allow for cutting of the carrier between the LEDs. This allows each of the LEDs to be separated from the others, with each of the LEDs having its own section of the carrier.

In one embodiment according to the present invention the LEDs are bonded to the carrier by a solder. The solder material can be previously deposited on the LEDs (as is the case with XBright® and XBright®Plus LEDs) or it can be surface deposited on the surface of the carrier before the LEDs are mounted to the carrier. As described above, in the case of a semiconductor carrier with metallized layers, the carrier should also be processed so that the solder bond does not degrade the ohmic contacts.

After flip chip mounting, the SiC substrate is the top-most layer and in step 18 the substrate is removed from each LED. Many different removal methods can be used and in one embodiment according to the present invention, the LEDs can be mechanically ground to remove all or most of the SiC substrate. A selective etch, such as fluorine based plasma, can be used to remove any SiC that remains on the LEDs after being mechanically ground. Due to the nonvolatile nature of Al—F compounds, a relatively low Al composition layer can also be incorporated into the n-type layer of each LED or at the SiC substrate interface with the n-type layer. The Al composition would allow the plasma etch to selectively stop on the $Al_xGa_{1-x}N$ n-type layer or at the Al at the SiC substrate interface.

Alternatively, the LEDs can include a lift-off layer that can be arranged between the SiC substrate and the remainder of the n-type layer. The lift-off layer can be exposed to a photo electrochemical etch (PEC) that etches the lift off layer without substantially etching the epitaxial layer(s). In one embodiment according to the present invention, the PEC etching comprises immersing the semiconductor device in a solution and illuminating the solution with light, with the composition of the solution and the wavelength of light causing the lift-off layer to be etched without etching the epitaxial layers. In this embodiment, the lift-off layer can comprise a material such as InGaN, AlInGaN and AlInGaAs and emersion preferred solution can comprise (1:3) KOH and water, which alone does not substantially etch the lift-off layer or the Group-III nitride epitaxial layers. If, however, the solution is illuminated by a light the solution can etch the lift off layer and not the epitaxial layers. Different wavelengths of light can be used, with a suitable wavelength being approximately 400 nanometers (nm). It is believed that the 400 nm light causes the material in the lift-off layer to form electron hole pairs and the hole position which is on the In atom permits the bonding of a hydroxide ion. This forms $In_2O_3$ with a $H_2$ gas by product and the removal of the In begins to quickly unravel the lift-off layer structure. To further enhance the etching of the InGaN lift-off layer, the KOH and water solution can be biased by placing a probe on the substrate and another in the solution. After the lift-off layer is PEC etched, the SiC substrate in each of the LEDs is separated from the remainder of its LED.

In another embodiment according to the present invention each the LEDs are GaN based and also comprise a lift-off layer between its n-type layer and SiC substrate, with the lift-off layer made of a material such as InGaN. The lift-off layer is exposed to laser illumination, instead of a PEC etch, to etch the lift-off layer. The laser should generate a wavelength of light that is not absorbed by the SiC substrate or GaN epitaxial layers, but is absorbed by the InGaN lift-off layer. SiC absorbs wavelengths of light of approximately 390 nm and less, GaN absorbs wavelengths of light of approximately 360 nm or less, and InGaN absorbs wavelengths of light of approximately 450 nm or less. The laser irradiation according to the present invention should have a wavelength between approximately 390 and 450 nm, with a suitable wavelength being approximately 400 nm. The SiC substrate and GaN layers are transparent to laser irradiation of this wavelength and when the irradiation strikes the lift-off layer, the light is absorbed. This causes the liftoff layer to heat up and dissipate, allowing the epitaxial layers and submount to separate. It should be understood that many other wavelengths of laser irradiation can be used between approximately 390 and 450 nm.

In still another embodiment according to the present invention, LEDs can be exposed to a nitrogen tri fluoride etch, which etches silicon carbide at a rate many times faster than in etches Group-III nitride epitaxial layers. Ions of nitrogen tri fluoride readily remove silicon carbide down to its interface with the Group-III nitride materials. Once the silicon carbide is removed, etching essentially stops because the etch rate of the epitaxial layers is so slow.

In the embodiments described above where the n- and p-type layers are left continuous on the substrate, the continuous layers can be cut or etched after the substrate is removed to divide the layers into individual emitting devices. Known mesa etching methods or mechanical sawing, laser cutting, and water-jet cutting can be used to divide the layers into individual devices.

Following removal of the SiC, in step 20 an ohmic contact or wire bond is deposited on the now exposed n-type GaN surface. The ability to make good ohmic contact directly to n-type Group-III nitrides has been demonstrated and by removing the SiC substrate a good contact can be made directly to the n-type layer. Removing the SiC substrate also eliminates the need for a conducting buffer at the SiC interface with the n-type Group III nitride layer, and also eliminates the power dissipation by the buffer. Eliminating this power dissipation at the buffer and substrate increases the efficiency of the LEDs and provides for better light extraction such that the wall plug efficiency of the LED is improved.

A bondpad can also be deposited over the top of the contact. One example of a stack that could serve this purpose would include Ti or Al for the contact, followed by Pt/Au or Ti/Pt/Au, respectively on the bondpad. In a preferred embodiment, the contact comprises Al due to its high reflectivity. The contacts and bondpads can be deposited using known techniques such as sputtering.

In step 22 the devices are singulated or separated, and many different separating methods/devices can be used. In one embodiment according to the present invention, the LEDs are separated using a diamond saw that cuts the carrier between the mounted LEDs. In another embodiment, the carrier is scribed or scored between the devices and the devices are broken apart.

In step 24 the individual LED devices can then be mounted in conventional packages using silver epoxy or by soldering. If solder is used the device-carrier solder bond must have an equal or higher melt temperature. Some examples of the solder for the bonding in order of increasing melt temperature are $Pb_{0.37}Sn_{0.63}$ followed by $Sn_{0.965}Ag_{0.035}$, Sn, $Sn_{0.8}Au_{0.2}$. The solder for bonding the LED on its carrier to the package may be deposited on the carrier or dispensed on the lead frame to which the LED and its carrier is to be attached. Wire bonds to the LED and/or its carrier are also included for applying a bias to the LED.

After each LED and carrier combination is mounted in its package, it can be encased in an encapsulating material. Another advantage of removing the SiC substrate from the LED pursuant to the method 10 is that the index of refraction between the LED material and the encapsulating material, such as an epoxy, is a closer match than compared with the SiC substrate, which provides improved light extraction by allowing a greater percentage of light that reaches the interface between the LED and the encapsulating material to escape.

The method 10 can be used in fabricating many different semiconductor devices having epitaxial layers made of many different materials with many different thicknesses. As discussed above, however, the method 10 is particularly adapted for fabricating LEDs.

Figure 2:
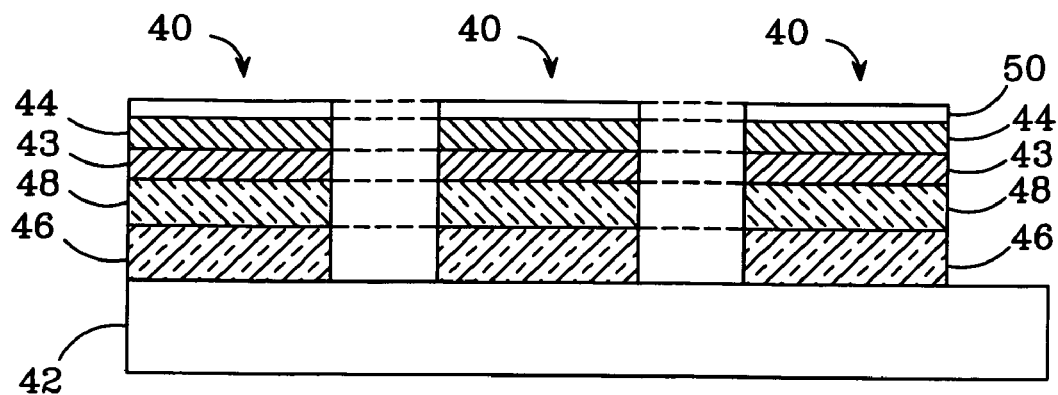
FIG. 2 is a sectional view of one embodiment of LEDs and formed on a substrate wafer according to the present invention.

FIG. 2 shows one embodiment of LEDs 40 formed on a substrate wafer 42 in an intermediate step in the method 10 above. The LEDs 40 are preferably made from the Group-III nitride material system and the substrate 42 is preferably made of SiC, although both can be made of different materials. Each of the LEDs 40 comprises its own n-type layer 46 and a p-type layer 48, with the n-type layer 46 between the substrate 44 and p-type layer 48. Other embodiments of the LEDs 40 can also comprise an active region (not shown) sandwiched between the n- and p-type layers 46, 48. First and second metal layers 43 and 44 can be formed on the p-type layer 48 and can be selected from among those metals (or alloys or layered combinations of metals) that are best for light reflection and ohmic contact purposes in conjunction with the Group III nitride p-type layer. Although two metal layers 43, 44 are illustrated, it is understood that the number of layers can be increased according to the present invention.

In one embodiment the LEDs can be first formed on the substrate wafer 42 as continuous n-type, p-type and metal layers 46, 48, 43, 44 substantially covering the top surface of the substrate wafer 42. The layers can then be separated into individual devices on the substrate 42 using mesa etching or one of the other methods described above. Although the substrate wafer 42 is shown with only three LEDs 40, it is understood that in practice a substrate wafer can hold thousands of LEDs 40. A bonding layer 50 can be included on the metal layers 43, 44 that bonds the LEDs 40 to the conductive carrier. In a preferred embodiment the bonding layer can be a carrier solder.

In an alternative embodiment, the n-type, p-type and metal layers 46, 48, 43, 44 can be left continuous on the substrate 42 for cutting later in the fabrication process. For these embodiments the portions of the layers between the devices (shown in phantom) is left until that later step. In one embodiment the layers 46, 48, 43, 44 are cut after flip-chip mounting and removal of the substrate 42, although they can also be cut at other stages of the fabrication process.

Figure 3:
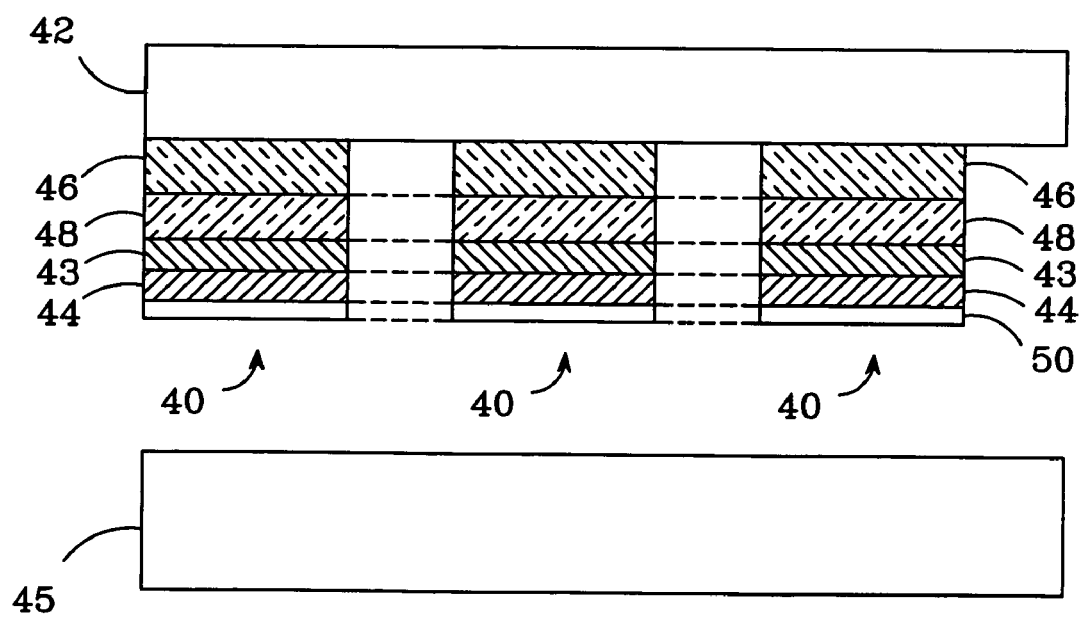
FIG. 3 is a sectional view of the LEDs and substrate wafer of FIG. 2 and a carrier, with the LEDs and substrate flipped in preparation for mounting to the carrier.

In FIG. 3, a carrier 45 is shown and the substrate wafer 42 and LEDs 40 of FIG. 2 in a flipped orientation in preparation for mounting to a carrier 45 in another intermediate step in the method 10. The carrier 45 can be made of conductive material and as described above, suitable materials include, but are not limited to, Cu, Cu—W, Cu—Mo—Cu, SiC or Si. The carrier 45 as shown in FIG. 3 is sized such that three LEDs 40 can be mounted to it although, like the substrate wafer 42, it can be sized to accommodate thousands of LEDs mounted that are mounted on a substrate wafer.

Figure 4:
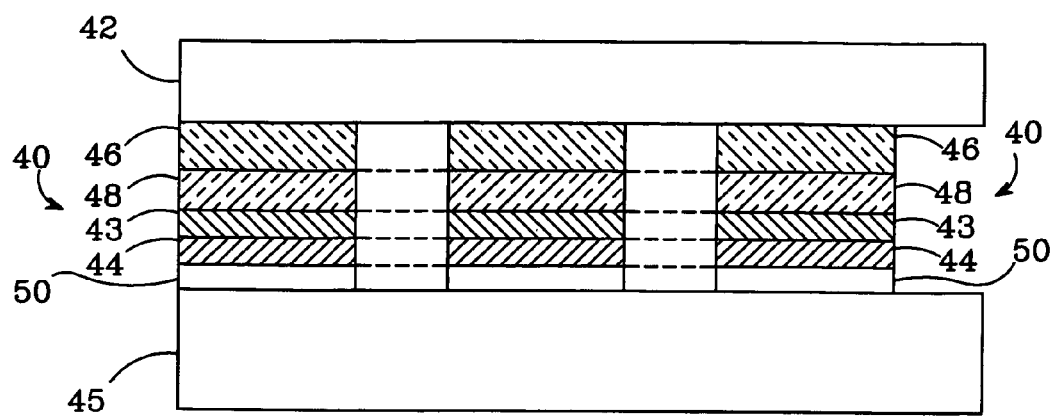
FIG. 4 is a sectional view of the LEDs, substrate wafer and carrier of FIG. 3, with the LEDs flip-chip mounted to the carrier.

FIG. 4 shows the LEDs 40, substrate 42, and carrier 45 of FIG. 3 at another intermediate step in the method 10, with the LEDs 40 flip-chip mounted on the carrier 45. In the embodiment shown, each of the LEDs 40 is mounted to the carrier by solder 50, although it is understood that other mounting methods and materials can be used. As a result of the mesa etching, the LEDs 40 are positioned such that there is room between adjacent LEDs 40 to allow for cutting of the carrier 45 between the LEDs. This allows each of the LEDs 40 to be separated from the others without damaging the LEDs 40, with each of the LEDs 40 then being mounted on its own section of the carrier 45.

Figure 5:
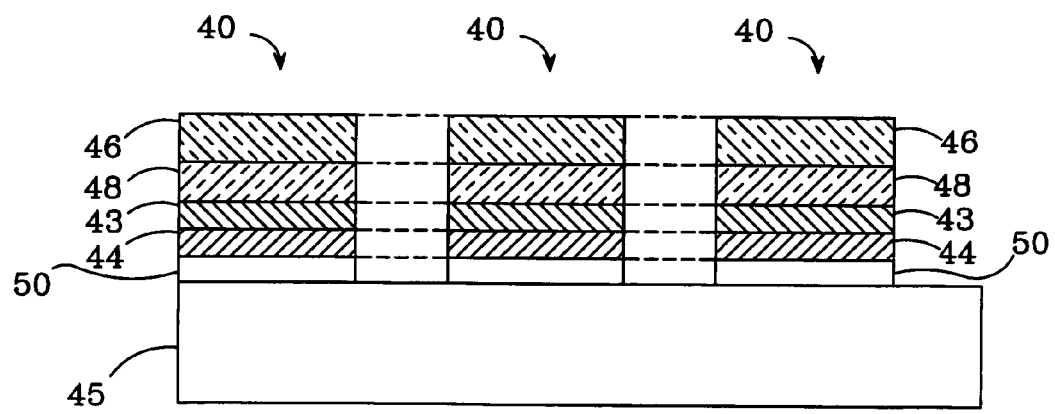
FIG. 5 is a sectional view of the structure of FIG. 4 with the substrate wafer removed from the LEDs.

FIG. 5 shows the LED 40 and carrier 45 structure of FIG. 4 after the SiC substrate 42 has been removed from the LEDs 40. Many different removal methods can be used, including the methods described above in conjunction with step 18 of the method 10 in FIG. 1. In some of the methods described, a lift-off layer (not shown) can be included between the substrate 42 and n-type layer 46, while in other methods an Al composition can be included in the n-type layer 46 at the junction with the substrate. After the substrate is removed the n-type layer 46 of each of the LEDs 40 is the top-most layer, with the surface of the n-type layers revealed. In the embodiments where the layers 46, 48, 43, 44 are left continuous, they can be cut into separate devices after the substrate 42 is removed.

Figure 6:
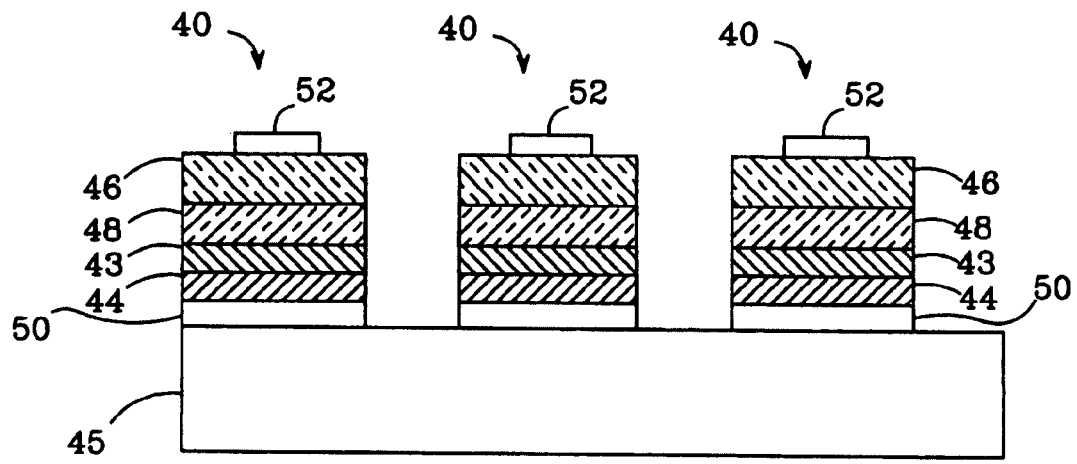
FIG. 6 is a sectional view of the structure of FIG. 5 with a contact deposited on the LEDs.

FIG. 6 shows the LEDs 40 and carrier 45 structure of FIG. 5 with a contact 52 deposited on the n-type layer 46 of each LED, with the contact comprising a material described above in conjunction with step 20 of the method 10. Over the top of the contact, a bondpad can also be deposited as described above.

Figure 7:
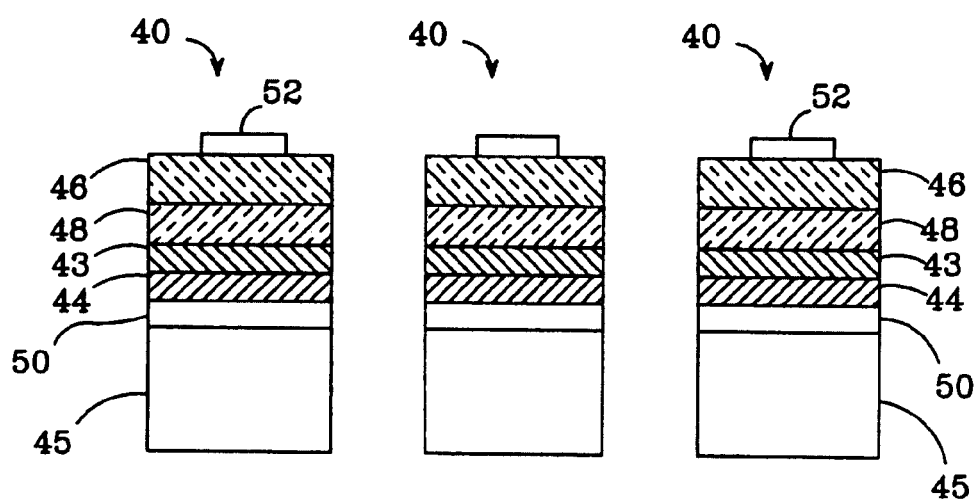
FIG. 7 is a sectional view of the structure of FIG. 6, after the carrier has been cut to separate the LEDs.

FIG. 7 shows the LEDs 40 and carrier 45 structure of FIG. 6 after the carrier 45 has been cut between each of the LEDs 40 using one of the methods described above in step 22 of the method 10, including using a diamond saw or scribing/scoring between the devices and breaking the devices apart. Each of the LEDs 40 is separated from the others, with each having its own section of the carrier 45.

Figure 8:
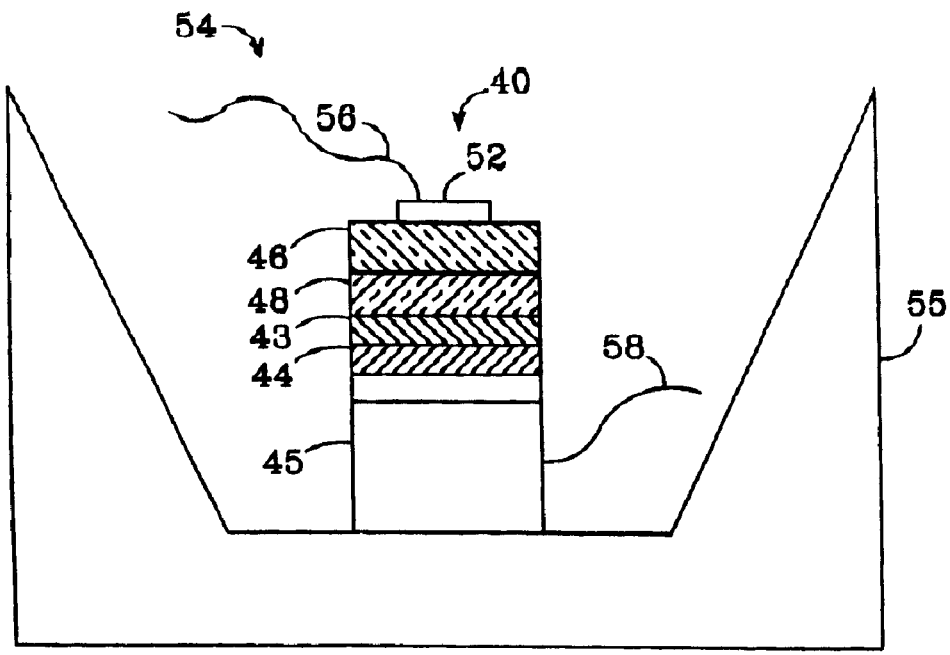
FIG. 8 is a sectional view of one of the LEDs in FIG. 7 mounted as an LED package.

FIG. 8 is a schematic showing how each of the LEDs 40 can then be arranged in an LED package 54, with the LED mounted in a lead frame 55 having a first conductive lead 56 to the contact 52. The carrier 45 can be contacted either through the lead frame 55 or through a second conductive lead 58 to the carrier 45. A bias applied to the leads 56, 58 causes the LED 40 to emit light. Each of the LEDs 40 can be bonded to its package using silver epoxy or by soldering, and the device can then be encapsulated in its package using a material such as a clear epoxy. The mirrors help reflect light emitting from the n- and p-type layers 46, 48 back toward the top surface of the LED 40 so it can contribute to the overall emission. The surfaces of the lead frame 55 can also reflect the light so that it contributes to the overall light emission of the package 54.

Figure 9:
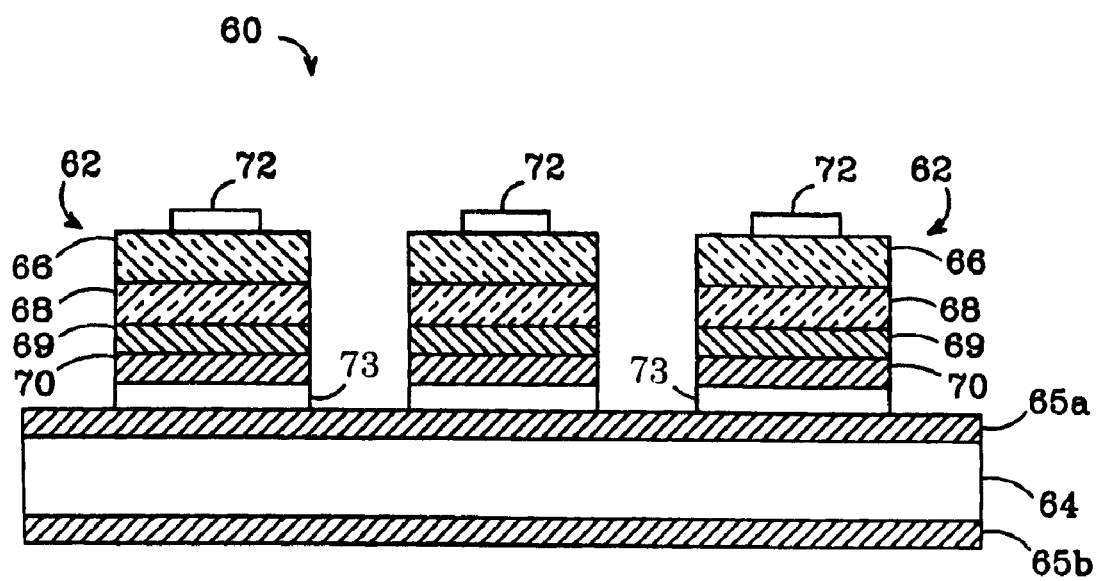
FIG. 9 is a sectional view of another embodiment according to the present invention of LEDs and flip-chip mounted on semiconductor carrier.

FIG. 9 shows another embodiment of a structure 60 according to the present invention comprising LEDs 62 flip-chip mounted on a carrier 64 pursuant to the method 10. The substrate wafer (not shown) is removed and a respective contact 72 is deposited on and makes good ohmic contact with each n-type layer 66. Each of the LEDs also comprises a p-type layer 68, first and second mirror layers 69, 70, and a solder 73 to bond the LEDs to the carrier 64.

The carrier 64 is made of a semiconductor material, such as SiC or Si, although other semiconductor materials can also be used. As described above in step 12 of the method 10, to provide low resistivity characteristics the carrier 64 can have first and second metalized layers 65a, 65b on both sides, with each of the layers 65a, 65b comprising a low resistivity material. The metallization on both sides of a semiconductor carrier should form ohmic contacts to each side. As also described above in step 12 of the method 10, the sides of the semiconductor carrier that are being bonded to the LED device or package by soldering should also be processed so that the solder bond does not degrade the ohmic contact on the face. The carrier 64 can be cut between the LEDs 62 to provide individual LEDs on a portion of the carrier 64 and the individual LEDs can be mounted in lead frame.

Figure 10:
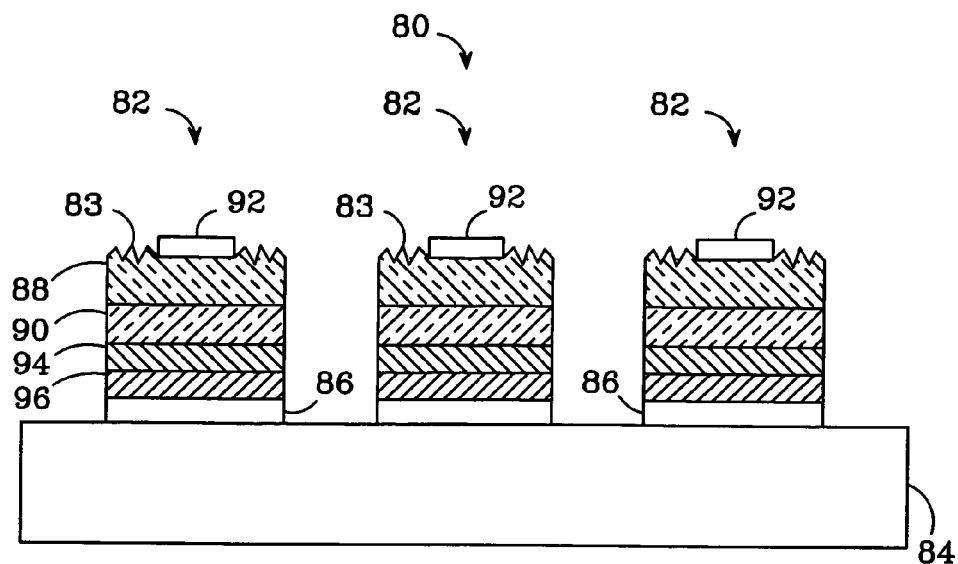
FIG. 10 is a sectional view of another embodiment according to the present invention of LEDs and flip-chip mounted on a conductive carrier, with the LEDs having a textured surface.

FIG. 10 shows another embodiment of a structure 80 according to the present invention comprising LEDs 82 flip chip mounted on a carrier 84, and bonded to the carrier, such as by a solder 86. The substrate (not shown) has been removed from the LEDs 84. The carrier 84 as shown is conductive although it is understood that the carrier 84 can also comprise a semiconductor material with metallization layers. Each of the LEDs 82 again comprises an n-type layer 88, p-type layer 90, a contact 92 deposited on the n-type layer 88, and mirror layers 94, 96. To further enhance light extraction from each of the LEDs 82, the surface 83 of the LEDs around and/or under the contact 92 can be textured. Many different processes can be used to texture the surface including but not limited to known processes such as plasma, chemical, or electrochemical etching. The textured surface provides varying surface angles to the light emitted from the LED toward the textures surface. The varying angles increase the chances that the light will reach the surface within its emission cone and will escape from the LED instead of being reflected by total internal reflection (TIR). In other embodiments according to the present invention, other surfaces of the LEDs 82 can be textured and the surfaces can be textured either before or after the carrier 84 is cut to provide individual LEDs.

Figure 11:
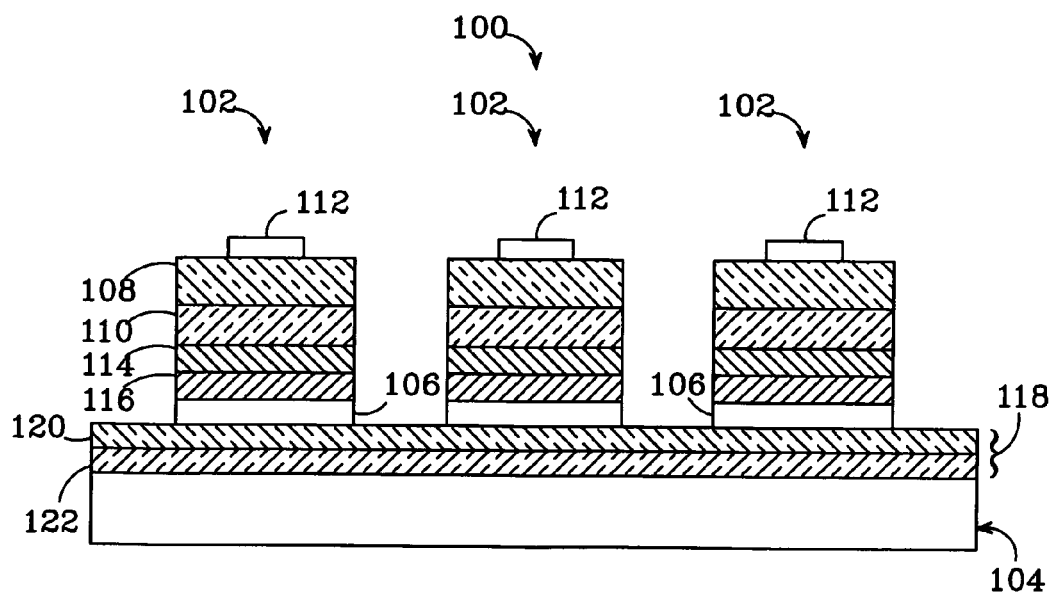
FIG. 11 is a sectional view of still another embodiment according to the present invention of LEDs and flip-chip mounted on a conductive carrier, with the carrier having a junction diode for electrostatic discharge protection.

FIG. 11 shows still another embodiment of a structure 100 according to the present invention having LEDs 102 flip-chip mounted to a carrier 104 and bonded in place by a solder 106. Each of the LEDs 102 comprises a first n-type layer 108, first p-type layer 110, contact 112 and first and second mirrors 114, 116. The carrier 104 further comprises a p-n junction diode 118 formed on it, with the diode 118 comprising a second layer of n-type material 120 adjacent to a second layer of p-type material 122. Each of the LEDs 102 is coupled to the junction diode 118, either before or after the carrier 104 is cut and the LEDs 102 are separated. In one embodiment, the anode of each of the LEDs 102 is coupled to the second n-type layer 120 of the diode 118 and the cathode of each of the LEDs is coupled to the second p-type layer 122. This arrangement couples each junction diode 118 in parallel with each of the LEDs 102 but with opposite polarity. The diode 118 provides electrostatic discharge (ESD) protection by the diode 118 protecting against reverse bias conditions. The carrier 104 can include metallization layers (not shown) to provide conductive characteristics.

The diode 118 can be made of the same or different material system as that of the LEDs 102. When the LEDs 102 are separated each has its own portion of the diode 118 as part of its carrier. The LEDs 102 can also have textured surfaces to enhance light extraction and the diode 118 can be included as part of a conductive or semiconductor carrier.

Figure 12:
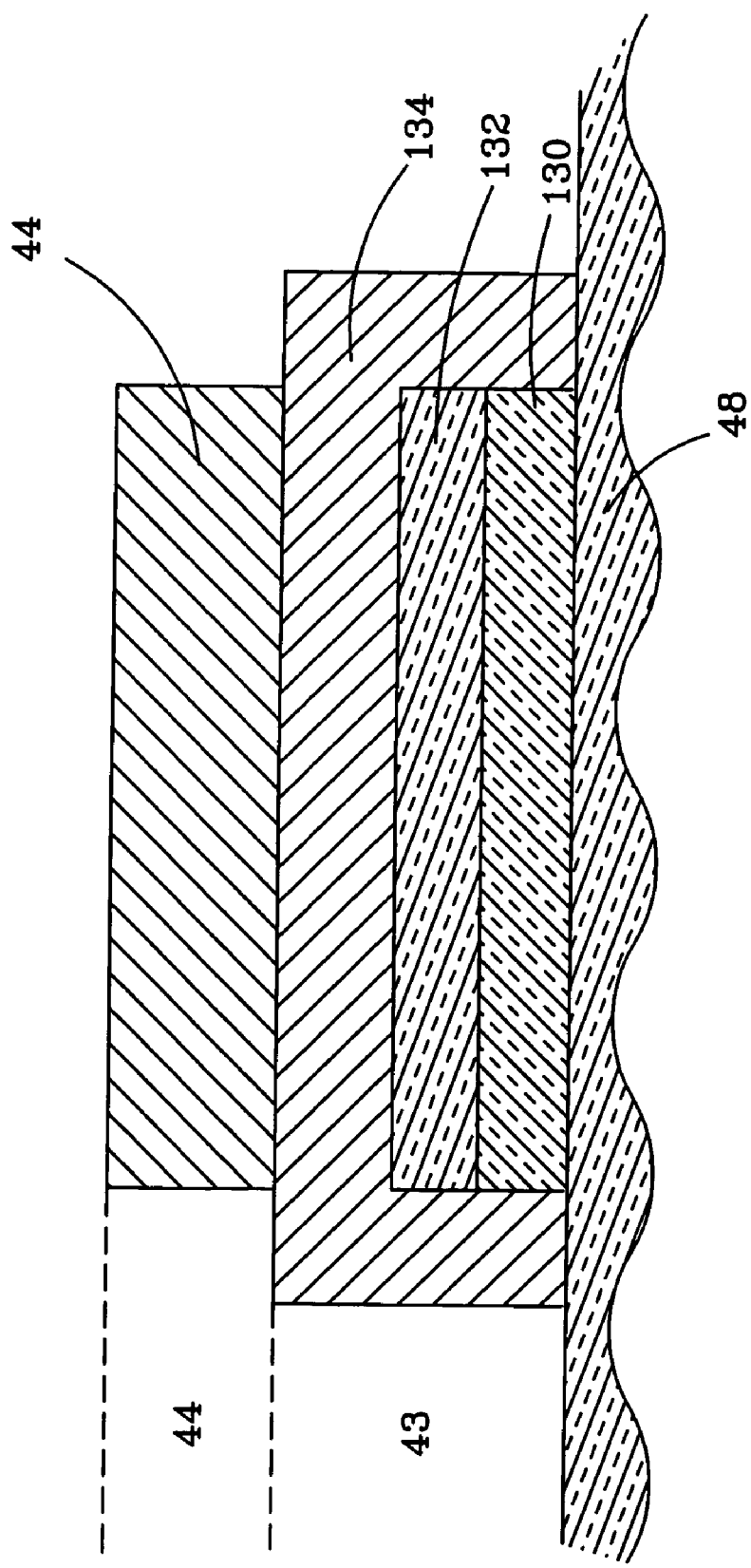
FIG. 12 is a sectional view one of embodiment of the mirror layers according to the present invention as in some of the LED structures.

FIG. 12 illustrates details about the metal layers 43 and 44 as shown in FIGS. 2-8 and shown with different reference numbers in FIGS. 9-11. FIG. 15 broadly indicates the layers 43 and 44 using dashed lines and the position of the semiconductor layer 48 by the curved line. In preferred embodiments metal layer 43 is a three layer structure formed by a layer of platinum (Pt) that forms an ohmic contact 130. The platinum ohmic contact layer 130 is preferably thin enough to be transparent; i.e. it transmits at least fifty percent (50%) of incident light. A silver (Ag) mirror layer 132 for light reflection is on the ohmic contact 130, and a barrier layer 134 not only covers, but also surrounds the ohmic contact and mirror layers 130, 132. As persons skilled in the metallurgy and semiconductor arts are well aware, silver tends to migrate among and between, and then react relatively quickly with certain other metals and semiconductor materials. In the present invention, such migration is highly undesirable and thus the barrier layer 134 is included to prevent silver from migrating beyond the mirror layer 132 and to similarly prevent the metal layer 44 from reacting with the silver mirror layer 132.

Other metals can be included in this portion of the structure, either in place of or in addition to those already described. For example, the barrier layer 134 can be formed of multiple layers, each of which can be a single metal or combination or alloy of two or more metals. In preferred embodiments, the barrier layer 134 is formed of such combinations or alloys of titanium, tungsten and platinum. The metals described with respect to FIG. 12 are thus exemplary rather than limiting of the invention.

With the ohmic contact layer 130 and the mirror layer 132 in place and encapsulated by the barrier layer 134, FIG. 12 further illustrates that the other metal layer 44 is on the barrier layer 134. In preferred embodiments the metal layer 44 is an alloy of gold (Au) and tin (Sn) for providing both excellent electrical conductivity and a secure bond with other structural layers.

Although the present invention has been described in considerable detail with reference to certain preferred configurations thereof, other versions are possible. In other embodiments, the LEDs are not separated from the other, but remain on single carrier. The LEDs can be biased simultaneously to emit light. The methods according to the present invention can be used to fabricate many different devices and the devices described above can have many different layer arrangements. Therefore, the spirit and scope of the appended claims should not be limited to the preferred versions in the specification.

I claim:

1. A method for fabricating semiconductor based light emitting devices, comprising:
providing a plurality of semiconductor layers on a substrate wafer, said plurality of semiconductor layers forming a plurality of light emitting devices, each of said light emitting devices comprising epitaxial layers and a lift-off layer between said substrate wafer and said epitaxial layers, said lift-off layer comprising a material from the group InGaN, AlInGaN, AlInGaAs;
providing a carrier comprising a junction diode on a first surface;
flip-chip mounting said light emitting devices on said first surface of said carrier such that said light emitting devices are sandwiched between said carrier and said substrate wafer;
exposing an n-type layer by removing said substrate wafer from said light emitting devices by exposing said lift-off layer to a solution and applying a light source, wherein said solution comprises KOH and water; and
separating said carrier into singulated portions to form light emitting devices separated from one another, with each of said light emitting devices mounted to a respective portion of said carrier.

2. The method of claim 1, wherein said plurality of semiconductor layers are separated into individual light emitting devices on said substrate wafer before said flip-chip mounting.

3. The method of claim 1, wherein said plurality of semiconductor layers are separated into individual emitting devices on said carrier, after said flip-chip mounting and after said removal of said substrate wafer.

4. The method of claim 1, wherein each of said emitting devices is mounted to said carrier by solder.

5. The method of claim 1, comprising the further step of mounting each of said separated light emitting devices and a respective portion of said carrier to a device package.

6. The method of claim 5, wherein each of said separated light emitting devices is mounted to said device package using silver epoxy or solder.

7. The method of claim 5, wherein each of said light emitting devices is encased in an encapsulating material.

8. The method of claim 7, wherein said encapsulating material comprises an epoxy.

9. The method of claim 1, wherein the combination of said solution and light source cause only said lift-off layer to etch.

10. The method of claim 1, wherein said removing of said substrate wafer from each of said light emitting devices comprises applying a laser light source to said light emitting device that is transparent to said substrate wafer and epitaxial layers but is absorbed by said lift-off layer.

11. The method of claim 1, wherein said epitaxial layers comprise GaN, and wherein removing said lift-off layer comprises illuminating said device with laser light having a wavelength in the range of approximately 390 and 450 nm.

12. The method of claim 11, wherein said laser light has a wavelength of approximately 400 nm.

13. The method of claim 1, wherein said separating of said carrier into singulated portions comprises dicing said carrier.

14. The method of claim 1, wherein said separating of said carrier into singulated portions comprises scoring said carrier and then breaking said carrier along said scores.

15. The method of claim 1, wherein each of said plurality of semiconductor light emitting devices comprises a light emitting diode (LED).

16. The method of claim 1, wherein said carrier further comprises a reflective layer, said reflective layer reflecting light that is emitted toward said carrier from each of said semiconductor light emitting devices.

17. The method of claim 1, wherein said carrier is made of a conductive material.

18. The method of claim 1, wherein said carrier is made of a semiconductive material, said carrier further comprising one or more layers of conductive material.

19. The method of claim 1, further comprising texturing one or more surfaces of said light emitting devices to enhance light extraction.

20. The method of claim 19, wherein said exposed n-type layer is textured.

21. A method for fabricating semiconductor based light emitting devices, comprising:
   providing a plurality of semiconductor layers on a substrate wafer, said plurality of semiconductor layers forming a plurality of light emitting devices, each of said light emitting devices comprising epitaxial layers;
   providing a carrier comprising a junction diode on a first surface;
   flip-chip mounting said light emitting devices on said first surface of said carrier such that said light emitting devices are sandwiched between said carrier and said substrate wafer;
   exposing an n-type layer by removing said substrate wafer from said light emitting devices; and
   separating said carrier into singulated portions to form light emitting devices separated from one another, with each of said light emitting devices mounted to a respective portion of said carrier;
   wherein each of said semiconductor based light emitting devices further comprises a lift-off layer between said substrate wafer and epitaxial layers, wherein said removing of said substrate wafer from each of said light emitting devices comprises exposing said lift-off layer to a solution and applying a light source, the combination of said solution and light source causing only said lift-off layer to etch, wherein said lift-off layer comprises a material from the group InGaN, AlInGaN and AlInGaAs, and wherein said solution comprises KOH and water and said light source has an approximate 400 nanometer (nm) wavelength.

22. A method for fabricating light emitting diodes (LEDs), comprising:
   providing a plurality of semiconductor layers on a SiC substrate wafer, said semiconductor layers forming a plurality of LEDs, each of said LEDs having an n-type layer and a p-type layer, said n-type layer sandwiched between said SiC substrate wafer and said p-type layer;
   providing a lift-off layer between said SiC substrate wafer and said n-type layer;
   disposing at least first and second reflective metal layers on said plurality of semiconductor layers;
   providing a carrier having a lateral surface to hold said LEDs;
   flip-chip mounting said LEDs on said carrier's lateral surface such that said LEDs are sandwiched between said SiC substrate wafer and said carrier;
   exposing said n-type layer by removing said SiC substrate wafer from said LEDs by removing said lift-off layer, wherein said lift-off layer is removed by exposing it to an etch solution and applying a light source, said solution comprising KOH and water and said light source having an approximate 400 nanometer (nm) wavelength;
   depositing a respective contact on said n-type layer of each of said LEDs; and
   separating said carrier into singulated portions, with each of said LEDs mounted to a respective portion of said carrier.

23. The method of claim 22, wherein said reflective metal layers for each of said LEDs are between said p-type layer and said carrier.

24. The method of claim 22, wherein said separating of said carrier into portions comprises dicing said carrier, or scoring said carrier and then breaking said carrier along said scores.

25. The method of claim 22, wherein said carrier further comprises a reflective layer to reflect light from each of said LEDs emitted toward said carrier.

26. The method of claim 22, wherein said carrier further comprises a junction diode, each of said separated LEDs having a portion of said junction diode, each of said LEDs coupled to said junction diode portion to protect said device from damage by electrostatic discharge.

27. A method for fabricating semiconductor based light emitting devices, comprising:
   providing a lift-off layer on a substrate wafer;
   providing a plurality of semiconductor layers on said substrate wafer with said lift-off layer, said plurality of semiconductor layers forming a plurality of light emitting devices, each of said light emitting devices comprising epitaxial layers;
   providing a carrier;
   flip-chip mounting said substrate wafer on said carrier such that said semiconductor layers are sandwiched between said carrier and said substrate wafer;
   removing said substrate wafer from said semiconductor layers by removing said lift-off layer, wherein said removing of said lift-off layer comprises exposing said lift-off layer to a photo electrochemical etch, wherein said removing of said lift-off layer comprises a combination of exposing said lift-off layer to a solution and applying a light source, the combination of said solution and light source causing said lift-off layer to etch without etching the surrounding semiconductor layers, wherein said lift-off layer comprises a material from the group InGaN, AlInGaN and AlInGaAs, and wherein said solution comprises KOH and water and said light source has an approximate 400 nanometer (nm) wavelength; and
   separating said semiconductor layers into singulated portions to form light emitting devices separated from one another.

28. The method of claim 27, wherein said removing of said lift-off layer comprises applying a laser light source to said device that is transparent to said substrate and epitaxial layers, but is absorbed by said lift-off layer.

29. A method for fabricating semiconductor based light emitting devices, comprising:
providing a lift-off layer on a substrate wafer;
providing a plurality of semiconductor layers on said substrate wafer with said lift-off layer, said plurality of semiconductor layers forming a plurality of light emitting devices, each of said light emitting devices comprising epitaxial layers;
providing a carrier;
flip-chip mounting said substrate wafer on said carrier such that said semiconductor layers are sandwiched between said carrier and said substrate wafer;
removing said substrate wafer from said semiconductor layers by removing said lift-off layer, wherein said removing of said lift-off layer comprises exposing said lift-off layer to a photo electrochemical etch, wherein said removing of said lift-off layer comprises a combination of exposing said lift-off layer to a solution and applying a light source, the combination of said solution and light source causing said lift-off layer to etch without etching the surrounding semiconductor layers; and
separating said semiconductor layers into singulated portions to form light emitting devices separated from one another;
wherein said substrate comprises SiC, said epitaxial structure comprises GaN, and said lift-off layer comprises a material from the group InGaN, AlInGaN and AlInGaAs, wherein removing said lift-off layer comprises illuminating said device with laser light having a wavelength in the range of approximately 390 to 450 nm.

30. The method of claim 29, wherein said laser light has a wavelength of approximately 400 nm.

* * * * *

UNITED STATES PATENT AND TRADEMARK OFFICE
CERTIFICATE OF CORRECTION

| | | |
|---|---|---|
| PATENT NO. | : 7,932,111 B2 | Page 1 of 1 |
| APPLICATION NO. | : 11/064798 | |
| DATED | : April 26, 2011 | |
| INVENTOR(S) | : John Edmond | |

It is certified that error appears in the above-identified patent and that said Letters Patent is hereby corrected as shown below:

Col. 9, paragraph 4, line 39, Fig. [15], should read Fig. --12--

Signed and Sealed this
Fourth Day of September, 2012

David J. Kappos
*Director of the United States Patent and Trademark Office*